United States Patent [19]

Nussbaum

[11] Patent Number: 4,611,165
[45] Date of Patent: Sep. 9, 1986

[54] PULSE RF FREQUENCY MEASUREMENT APPARATUS

[75] Inventor: Samuel E. Nussbaum, Sherburne, Minn.

[73] Assignee: Honeywell Inc., Minneapolis, Minn.

[21] Appl. No.: 595,162

[22] Filed: Mar. 30, 1984

[51] Int. Cl.⁴ .............................................. G01R 23/16
[52] U.S. Cl. .................................. 324/77 B; 324/77 D
[58] Field of Search ................ 324/77 R, 77 B, 77 C, 324/77 CS, 77 D, 307, 314, 312; 455/126; 343/7.5

[56] References Cited

U.S. PATENT DOCUMENTS

| 4,001,825 | 1/1977 | Burgers | 343/7.5 |
| 4,065,714 | 12/1977 | Hill | 324/314 |
| 4,066,965 | 1/1978 | Schultz | 455/126 |
| 4,504,785 | 3/1985 | Tucker | 324/77 B |

Primary Examiner—Michael J. Tokar
Attorney, Agent, or Firm—Robert A. Pajak

[57] ABSTRACT

Disclosed is a method and apparatus for determining the RF carrier frequency of a stream of pulse RF signals. A stream of pulse RF signals is dithered and subsequently fed into a frequency spectrum analyzer. A spectrum analysis of the dithered stream of RF pulses or signals derived therefrom provides improved resolution in the measurement of the RF frequency of the pulse RF signals.

6 Claims, 5 Drawing Figures

FREQUENCY SPECTRUM

PULSE RF FREQUENCY MEASUREMENT APPARATUS

BACKGROUND OF THE INVENTION

This invention relates to pulse radar systems, and more particularly, an apparatus and method for measuring the RF carrier frequency of a stream of pulse RF signals.

Radar and electronic warfare system commonly employ pulse RF signals with narrow pulse widths and low duty cycles. Such systems demand accurate knowledge of the RF carrier frequency. Existing automated techniques include pulse RF frequency counters, spectrum analyzers, synchronous detectors, and digital frequency discriminators, among others. These techniques cannot provide the required frequency measurement accuracy for current state-of-the-art radar and electronic warfare systems.

Pulse frequency counters, due mainly to gate jitter, can provide 500 Khz accuracy for a 100 ns pulse width signal. Synchronous detectors are limited to 10 Khz measurement accuracy for a 100 ns pulse width signal. Digital frequency discriminators can provide 100 Khz measurement accuracy for a 100 ns pulse width signal. Each of these techniques require substantial additional hardware to typical electronic warfare and radar automatic measurement systems. The spectrum analyzer is also limited in measurement accuracy for narrow pulse widths. The spectrum analyzer accuracy for 100 ns pulse width is typically 150 Khz.

It is an object of the invention to provide a measurement of the RF frequency of a stream of pulse RF signals utilizing a spectrum analyzer or other such systems with improved resolution.

BRIEF DESCRIPTION OF THE INVENTION

A stream of pulse RF signals or a signal derived from the RF pulse signals is dithered prior to being presented to a frequency measuring system, and more specifically a spectrum analyzer.

A BRIEF DESCRIPTION OF THE DRAWINGS

DETAILED DESCRIPTION OF THE INVENTION

Figure 1:
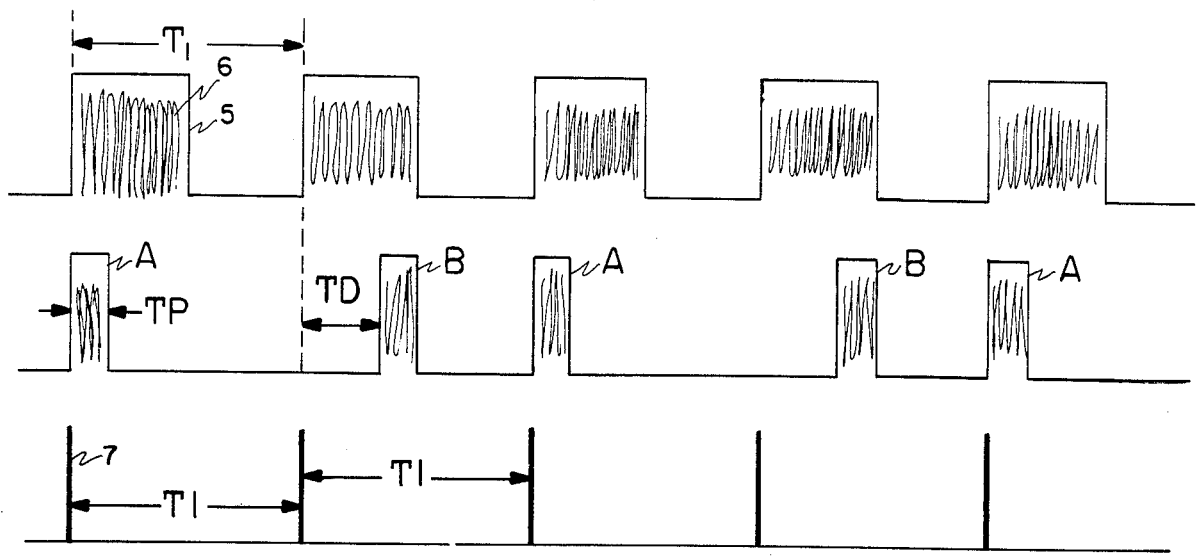
FIG. 1 is a timing chart illustrating the principles of the invention.

Illustrated in FIG. 1 is a stream of pulse RF signals 5 having a common carrier frequency 6 and having a fixed pulse repetition rate, i.e. a fixed time separation T1 between pulses. It is the intended function of the invention, to determine what is the RF carrier frequency 6 of the pulse stream.

Figure 2:
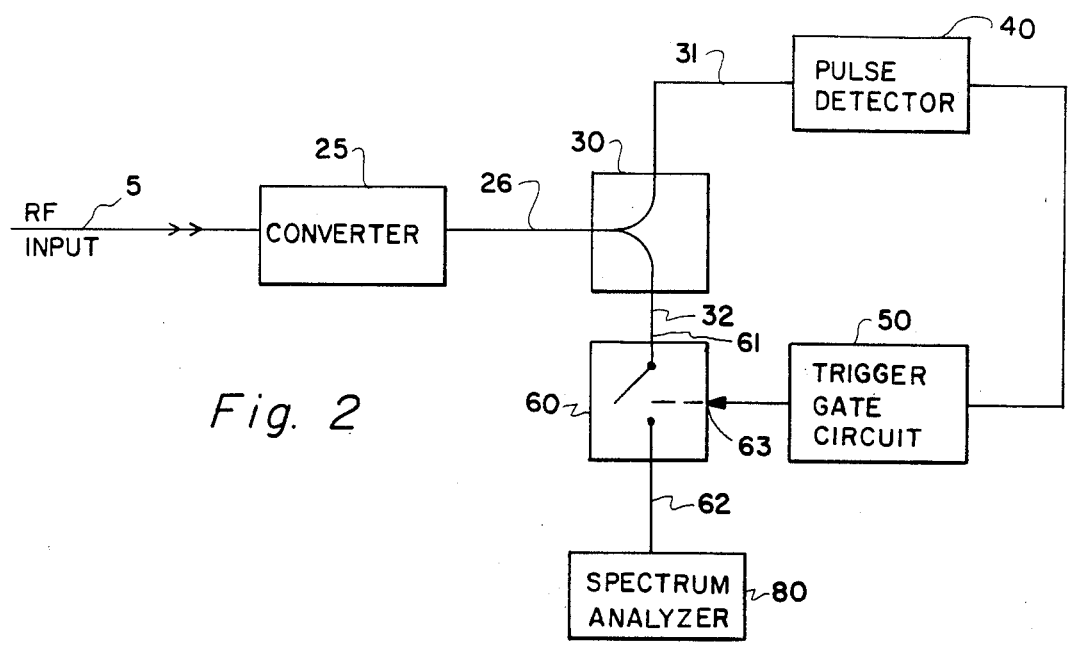
FIG. 2 shows a block diagram of one embodiment of the invention.

Shown in FIG. 2 is a block diagram showing one embodiment of the present invention. The pulse RF signal 5 is presented to a signal convertor 25 for down converting, or up converting, so as to establish a stream of pulses 26 having a carrier frequency derived from the RF carrier frequency of the input stream of pulses. This signal in turn is passed through a power splitter 30 having output signals 31 and 32.

The signal on 31 is presented to a pulse detector 40 which provides a timing pulse corresponding to each leading edge of the pulse stream presented thereto. In turn, the timing pulses are applied to trigger gate circuit 50 which provides alternately occurring first and second trigger pulses as will be subsequently described.

Power splitter signal 32 is electrically connected to a first terminating means 61 of switch means 60 which is capable of passing signal 32 to second terminating means 62 in response to command pulses applied to command input means 63 which are trigger pulses provided by trigger gate circuit means 50. The output of second terminating means 62 of switch means 60 is presented as an input to frequency spectrum analyzer 100.

Pulse detector 40 may be provided by a variety of circuits for providing a timing pulse similar to those indicated by a numeral 7 in FIG. 1. These timing pulses are presented to trigger gate circuit means 50.

Figure 3:
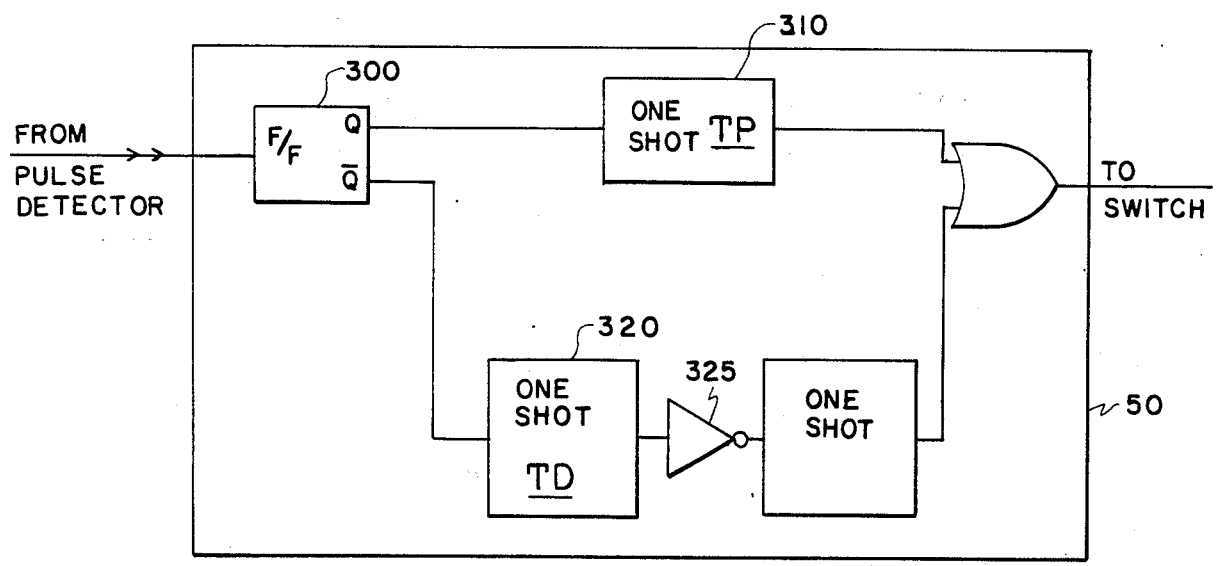
FIG. 3 is one schematic diagram of a trigger gate circuit of FIG. 2.

FIG. 3 illustrates an example of one circuit implementation of trigger gat circuit 50 for practicing the principles of the present invention. Referring to FIG. 3, a flip-flop 300 toggles for each occurring timing pulse provided by pulse detector 40. The Q output is connected to a one shot circuit 310 having a time duration TP. The $\overline{Q}$ output is connected to a second one shot 320 having a time duration TD. The output of one shot 320 is presented, through a logical inverting circuit 325, to a third one shot 330 having the same time duration TP as one shot 310. The output of one shot 310 and 330 is provided as two inputs to OR gate 340 providing the trigger pulses to switch means 60.

The trigger gate circuit 50 provides alternately first and second pulses. Referring to FIG. 1, the first pulse is identified as A and the second pulse is identified as B. The first pulse is provided when the flip-flop Q output changes to a high triggering one shot 310 having a duration TP. Pulse B is a result of the flip-flop Q output going high which in turn triggers one shot 330 through inverter 325 after a time delay TD established by one shot 320. Since the timing pulses provided by pulse detector 40 toggles the flip-flop 300, the output of trigger gate circuit 50 is a stream of trigger pulses having alternately occurring first and second pulses in which (i) the separation between the first and second pulse is substantially equal to time separation between the timing pulses Tl plus a fixed time TD established by one shot 320, and (ii) a separation between the second pulse B and the next immediately following first pulse A substantially equal to the time separation between, the timing pulses less the fixed time delay. Thus, the trigger pulses are dithered and have a repetition frequency which is related by the time factor: T1±TD, and have pulse duration TP.

As a result of the stream of trigger pulses applied to switch means 60, the spectrum analyzer only sees the RF signal during the duration of the trigger pulses. In essence, the spectrum analyzer is seeing the pulse repetition frequency of the RF signal dithered plus and minus the time period TD.

Figure 4:
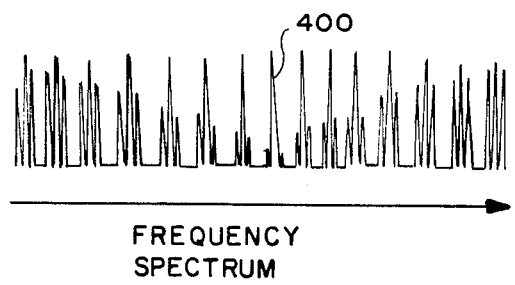
FIG. 4 is graphical representation of a spectrum analysis.

Shown in FIG. 4 is an example of a display of the spectrum analyzer such as a Hewlett Packard HP-8566. As illustrated in FIG. 4, the resulting frequency spectrum of the dithered RF pulses as described above, includes side bands in addition to side bands associated with the RF pulse repetition frequency. These secondary side bands decrease in amplitude about the carrier frequency indicated by numeral 400. As indicated earlier, the accuracy of the spectrum analyzers of the prior art was limited by the pulse width and was in the order of 150 KHZ. By dithering the RF signal in a manner as described, the accuracy and resolution for determining the carrier frequency approaches the actual accuracy of the spectrum analyzer (+20 Hz) and obviates the problems associated with the narrow pulse widths.

Using the spectrum analyzer and the dithered pulse repetition frequency as described above as the input, there exists at least two techniques for determining the RF carrier of the pulse RF signals. The first technique is to take one sweep of the display signal and do a curve fit to determine center frequency, similar to techniques well known without using the dithering concept of the present invention. Because of the dithered pulse repetition frequency, improved accuracy is obtained since the spectral line associated with the carrier frequency becomes sharper. The second technique consists of monitoring the amplitude of the side bands for determining RF of spectral frequency having the lowest side band amplitudes in combination with the dithered repetition frequency, accuracy and resolution may approach values accuracy of the frequency analyzer.

Figure 5:
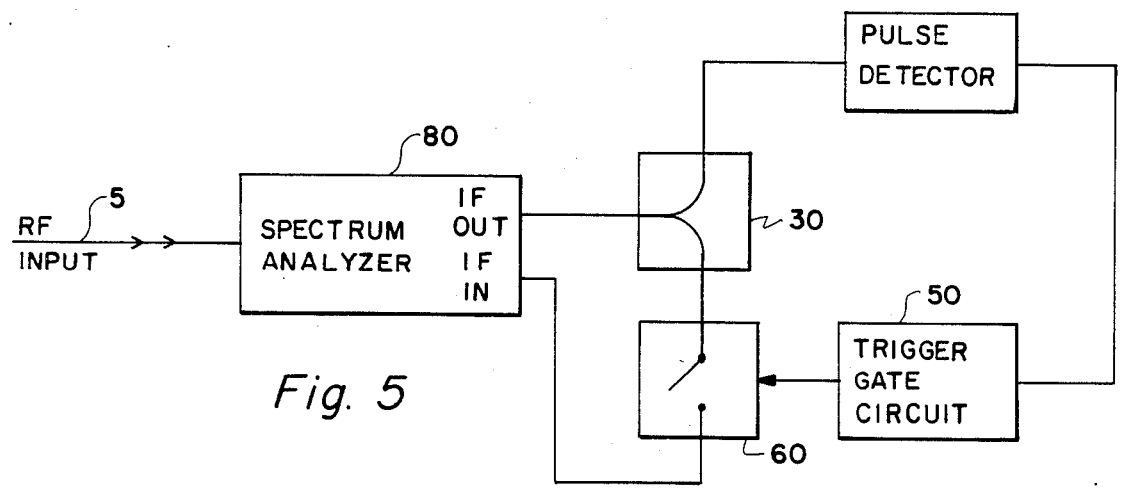
FIG. 5 shows another embodiment of the invention.

Shown in FIG. 5 is an alternate embodiment of the present invention. Components shown in FIG. 5, having the same intended function as those shown in FIG. 2, have retained the same numeral designation. FIG. 5 is essentially that of FIG. 1 except the spectrum analyzer includes the conversion circuit 25 as part thereof. The spectrum analyzer has a first IF output and a first IF input. The first IF output is a signal similar to that provided by converter 25.

It must be realized by those skilled in the art, that dithering the pulse repetition frequency prior to frequency analysis of the pulse RF signals provides a method for improving the ability to measure the RF carrier frequency of the pulsed RF signals. It is to be expressly understood that the invention is not limited to the embodiments of the invention illustrated and described herein. Various changes may also be made in the design and arrangement of the parts without parting from the spirit and scope of the invention and the same will now be understood by those skilled in the art.

It should be particularly noted that although pulse detector 40 received signals from power splitter 30, it should be recognized by those skilled in the art that any means for providing timing pulses corresponding to the RF pulses which will be dithered is all that is required. Thus, it may be possible to avoid the need for power splitter 30. Switch mean 60 may be any high speed switch such as a PIN switch capable of passing RF signals.

The embodiments of the invention in which an exclusive property or right is claimed are defiend as follows:

1. A method of determining the RF carrier frequency of a first stream of pulses of an RF signal comprising the steps of:
    receiving said first stream of pulses;
    deriving from said first stream of pulses a second stream of pulses having alternately occurring first and second pulses each having a carrier frequency directly related to said RF carrier frequency, and having
        (i) a separation between sid first and second pulses substantially equal to the pulse period of said first stream of pulses plus a fixed time increment, and
        (ii) a separation between said second pulse and an immediately following first pulse substantially equal to said pulse period less said fixed time increment; and
    frequency analyzing said second stream of pulses to determine said RF frequency.

2. The method of claim 1 further comprising the steps of:
    measuring side band amplitudes of frequency spectral lines resulting from said step of frequency analyzing; and
    signal processing said side band amplitudes to determine which of said spectral lines has a minimum side band amplitude thereby indicating said RF carrier frequency.

3. An apparatus for determining the RF carrier frequency of a first stream of pulses of an RF signal comprising:
    signal means for deriving from said first stream of pulses a second stream of pulses having alternately occurring first and second pulses each having a carrier frequency directly related to said RF carrier frequency, and having
        (i) a separation between said first and second pulses substantially equal to the pulse period of said first stream of pulses plus a fixed time increment, and
        (ii) a separation between said second pulse and an immediately following first pulse substantially equal to said pulse period less said fixed time increment; and
    means for frequency spectrum analyzing said second stream of pulses and providing a frequency spectrum output.

4. The apparatus of claim 3 further comprising:
    means for measuring side band amplitudes of frequency spectral lines derived from said frequency spectrum output; and
    means for signal processing said side band amplitudes to determine which of said spectral lines has a minimum side band amplitude thereby indicating said RF carrier frequency.

5. The apparatus of claim 3 wherein said signal generating means includes:
    pulse detector means for providing a timing pulse corresponding to the leading edge of said first stream of pulses;
    gating means responsive to said timing pulses for providing a stream of alternately occurring first and second trigger pulses having,
        (i) a separation between said first and second trigger pulses substantially equal to said pulse period plus a fixed time increment, and
        (ii) a separation between said second trigger pulse and an immediately following first trigger pulse substantially equal to said pulse period less said fixed time increment; and
    switch means responsive to said stream of trigger pulses for passing at least a portion of a first signal derived from said first stream of pulses between first and second terminating means and having a duration established by said first and second trigger pulses, said second terminating means being electrically connected to said means for frequency spectrum analyzing.

6. The apparatus of claim 5 wherein said signal generating means further includes a power splitter means for providing a first portion of said first signal to said pulse detection means and a second portion electrically connected to said switch means first terminating means.

* * * * *